United States Patent
Murakawa et al.

(10) Patent No.: US 8,071,943 B2
(45) Date of Patent: Dec. 6, 2011

(54) MASK INSPECTION APPARATUS AND IMAGE CREATION METHOD

(75) Inventors: Tsutomu Murakawa, Tokyo (JP); Toshimichi Iwai, Tokyo (JP); Jun Matsumoto, Tokyo (JP); Takayuki Nakamura, Tokyo (JP); Yoshiaki Ogiso, Tokyo (JP)

(73) Assignee: Advantest Corp., Tokyo (JP)

( * ) Notice: Subject to any disclaimer, the term of this patent is extended or adjusted under 35 U.S.C. 154(b) by 213 days.

(21) Appl. No.: 12/653,792

(22) Filed: Dec. 21, 2009

(65) Prior Publication Data

US 2010/0196804 A1 Aug. 5, 2010

Related U.S. Application Data

(60) Provisional application No. 61/206,821, filed on Feb. 4, 2009.

(51) Int. Cl.
*G01N 23/00* (2006.01)
*H01J 37/28* (2006.01)

(52) U.S. Cl. ... 250/306; 250/307; 250/310; 250/492.22; 250/492.2; 250/396 R; 430/5; 382/144

(58) Field of Classification Search .................. 250/306, 250/307, 310, 396 R, 492.22, 492.2; 430/5; 382/144
See application file for complete search history.

(56) References Cited

U.S. PATENT DOCUMENTS

| 2008/0013824 A1* | 1/2008 | Yamaguchi et al. ........... 382/149 |
| 2010/0026722 A1* | 2/2010 | Kondo ........................... 345/660 |
| 2010/0102225 A1* | 4/2010 | Itou et al. ...................... 250/307 |

FOREIGN PATENT DOCUMENTS

JP 2000-294183 10/2000

* cited by examiner

*Primary Examiner* — Nikita Wells
(74) *Attorney, Agent, or Firm* — Muramatsu & Associates

(57) ABSTRACT

Provided is a mask inspection apparatus including: emitting unit for emitting electron beams onto a sample; electron detecting unit for detecting the quantity of electrons produced, by the emission of the electron beams, from the sample with patterns formed thereon; image processing unit for generating image data for the patterns on the basis of the electron quantity; and controlling unit for controlling the emitting unit, the electron detecting unit, and the image processing unit. The controlling unit calculates, from the size of a designated observation area of the sample, a division number of divisional images that are synthesized to form a joint image that covers the entire designated observation area. The controlling unit determines divisional areas so that adjacent divisional areas partially overlap each other. The controlling unit acquires SEM images for the respective divisional areas. The controlling unit synthesizes the SEM images of the divisional areas on the basis of coordinate data for the divisional areas and on the basis of edge information for patterns included in the overlapping regions, and thereby creates an SEM image of a wide field of view that covers the observation area.

10 Claims, 13 Drawing Sheets

FIG. 8A
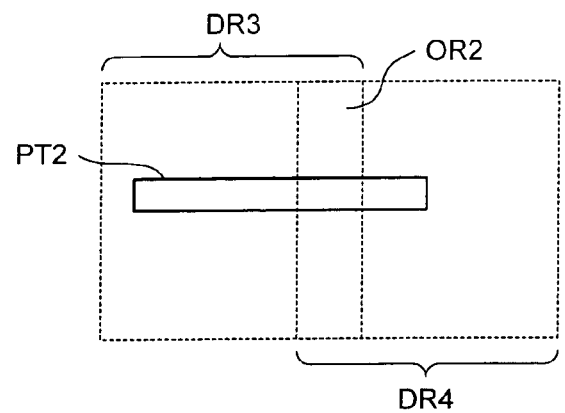
FIG. 8B     FIG. 8C
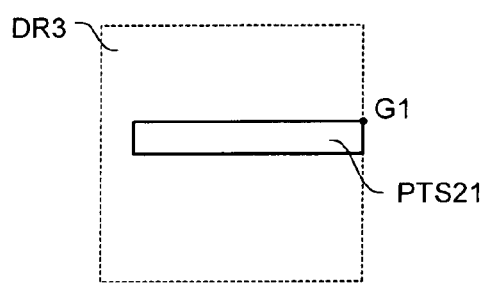 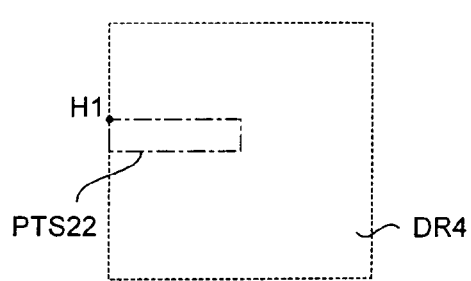
FIG. 8D
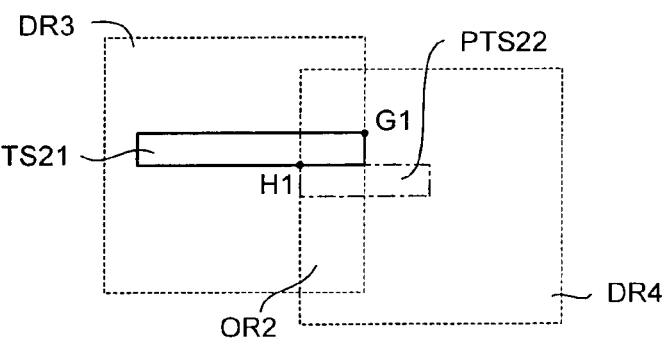
FIG. 8E
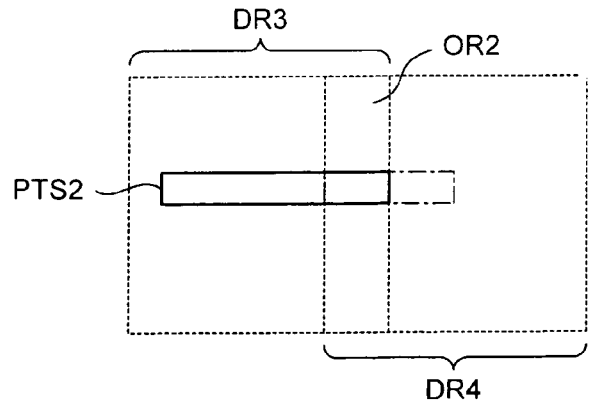

MASK INSPECTION APPARATUS AND IMAGE CREATION METHOD

This application claims the benefit of U.S. Provisional Patent Application Ser. No. 61/206,821 filed Feb. 4, 2009, all of which are hereby incorporated by reference.

BACK GROUND OF THE INVENTION

1. Field of the Invention

The invention relates to a mask inspection apparatus and an image creation method which are capable of creating an image of a wide field of view and of a high resolution.

2. Description of the Prior Art

In a lithography process of semiconductor manufacturing processes, patterns formed on a photomask is exposed to light by an exposure apparatus and is transferred onto a wafer. If the patterns formed on the photomask have any defects or distortions, such defects or distortions may result in lower exposure precision. For example, the patterns cannot be transferred to desired positions, or the shapes of the patterns may be transferred incorrectly. To prevent the decrease in the exposure precision, the photomask is inspected to check whether or not there are any positional errors or defects.

A method of inspecting photomasks uses SEM images of masks obtained by scanning electron microscopes. A scanning electron microscope emits incident electrons onto an electron-beam scanning area of a sample. A scintillator is employed to acquire the secondary electrons emitted from the sample. The quantity of the electrons thus acquired is converted to the luminance. Thereby, data on an SEM image are obtained and displayed on a display apparatus.

For example, the patterns formed on a mask are inspected using the line widths of the patterns in accordance with the following procedure. Firstly, a predetermined area of the patterns formed on the photomask is displayed on the display apparatus. Then, electron beams are emitted aiming at a measurement point located within the displayed area. On the basis of the secondary electrons reflected from the measurement point, the waveform of the luminance distribution is acquired. The luminance-distribution waveform thus acquired is analyzed to identify the positions of pattern edges. On the basis of these pattern-edge positions, the width of each line is defined. Whether or not the line width is within an acceptable error range is determined so as to determine whether or not the quality of the photomask is satisfactory.

There is another, already-known mask-inspection method. The method uses a mask to be inspected and a mask model. A simulation of transferring the patterns formed on the mask onto a wafer is conducted, and the result of the simulation is compared with the mask model. Specifically, according to the mask inspection method, how the patterns formed on the mask are transferred onto a wafer is simulated, firstly, using the mask to be inspected. To this end, an image for inspection is acquired by the transmitted light and the reflected light. The result of this simulation is compared with the result of another simulation, which is a simulation of how the patterns formed on a correct mask are transferred to a wafer. This is how to check whether or not there are any defects or the like in the patterns formed on the mask to be inspected. Carrying out this transfer simulation requires a field of view of 10-µm diameter. Whether or not there are any defects or the like in the patterns formed on the mask is checked by comparing the mask model and the SEM image. The patterns formed on the entire photomask are reflected in the mask model, so that the SEM image to be compared with the mask model must be an SEM image of a wide field of view.

The mask-inspection apparatus using the above-described scanning electron microscope and the like requires high-precision measurement. Hence, it is a common practice to acquire an SEM image of a high-magnification SEM image in a restricted narrow field of view with a high-magnification. In addition, if a wide field of view is scanned by an ordinary critical dimension SEM, various kinds of aberrations such as the astigmatism, the field curvature, and the distortion inevitably take place. These kinds of aberrations must be corrected, dynamically, in a simultaneous manner with the scanning action. The dynamic and simultaneous correction imposes a heavy load on the mask-inspection apparatus, or worse yet, the correction can be done imperfectly.

Japanese Patent Application Publication No. 2000-294183 discloses a technique to address this problem. According to the disclosed technique, when SEM images of a sample are acquired piece by piece using an SEM, the sample stage is driven automatically, so that a series of photos that cover a wide field of view can be easily obtained.

Nevertheless, when the sample stage is moved so as to take an image of a particular divisional area, the movement of the sample stage is not always as precise as required. Hence, even when a series of photos to be joined are taken, the photos cannot necessarily be synthesized successfully into a perfect single-piece photo of a wide field of view.

SUMMARY OF THE INVENTION

The invention has been made in view of the above-described problems of the conventional techniques. An object of the invention is to provide a mask inspection apparatus and an image creation method which are capable of creating a high-resolution SEM image covering a wide field of view and which are capable of extracting the contour data from the SEM image.

The above-described problems are solved by a mask inspection apparatus including: emitting unit for emitting electron beams onto a sample; electron detecting unit for detecting the quantity of electrons produced, by the emission of the electron beams, from the sample with patterns formed thereon; image processing unit for generating image data for the patterns on the basis of the quantity of electrons; and controlling unit for controlling the emitting unit, the electron detecting unit, and the image processing unit, in which the controlling unit calculates, from the size of a designated observation area of the sample, a division number of divisional images that are synthesized to form a joint image that covers an entire designated observation area, the controlling unit determines divisional areas so that adjacent divisional images partially overlap each other, the controlling unit acquires SEM images for the respective divisional areas, and the controlling unit synthesizes the SEM images of the divisional areas on the basis of coordinate data for the divisional areas and on the basis of edge information for patterns included in the overlapping regions, and thereby creates an SEM image of a wide field of view that covers the observation area.

The mask inspection apparatus according to this embodiment may be configured so that data on the SEM image of each of the divisional areas include coordinate data for the divisional area, the controlling unit converts the coordinate data into coordinate data for the designated observation area, and the controlling unit synthesizes the SEM images of the adjacent divisional areas on the basis of the converted coordinate data for the divisional areas. In addition, the mask inspection apparatus according to this embodiment may be configured so that the controlling unit detects a pattern included in an overlapping region where portions of adjacent divisional areas overlap each other, and the detected pattern is used as a pattern for an aligning operation, the controlling unit detects an edge of the pattern in each of the divisional areas with precision of 1/100 pixels, the controlling unit corrects the coordinate data of the divisional areas so that the difference between an edge position of the pattern in one of the divisional areas and the corresponding edge position of the pattern in another one of the divisional areas becomes zero.

According to another different embodiment of the invention, provided is an image creation method executed in the mask inspection apparatus according to the above-described embodiment. The image creation method according to the different embodiment includes the steps of: calculating, from the size of a designated observation area of the sample, a division number of divisional images that are synthesized to form a joint image that covers an entire designated observation area; determining divisional areas so that adjacent divisional images partially overlap each other; acquiring SEM images for the respective divisional areas; executing a first operation of aligning the divisional areas on the basis of coordinate data for the divisional areas; executing a second operation of aligning the divisional areas on the basis of edge information for patterns included in the overlapping regions; and creating an SEM image of a wide field of view that covers the observation area by synthesizing the SEM images of the divisional areas.

In the image creation method according to this embodiment, the step of executing the first aligning operation includes the steps of: acquiring coordinate data held by data on the SEM image of each of the divisional areas; converting the coordinate data for the divisional areas into coordinate data for the designated observation area; and synthesizing the SEM images of adjacent divisional areas on the basis of the converted coordinate data for the divisional areas. In addition, the step of executing the second aligning operation includes the steps of: detecting a pattern for the aligning operation included in an overlapping region where portions of the adjacent divisional areas overlap each other; detecting an edge of the pattern in each of the divisional areas with precision of 1/100 pixels; calculating the difference between an edge position of the pattern in one of the divisional areas and the corresponding edge position of the pattern in another one of the divisional areas; and correcting the coordinate data of the divisional areas so that the difference becomes zero.

According to the invention, an image of a wide field of view corresponding to the designated observation area is acquired in the following way. Firstly, the designated observation area of the sample is divided into plural divisional areas so that the adjacent divisional areas partially overlap each other. Then, a high-precision image is acquired for each of the divisional areas. After that, the images of all the divisional areas are synthesized on the basis of the coordinate data for each divisional area and of the edge information for each pattern formed in each of the portions where adjacent divisional areas overlap each other. Accordingly, it is possible to create a high-precision sample image even if the image must cover a wide field of view.

BRIEF DESCRIPTION OF THE DRAWINGS

FIGS. 8A to 8E are a set of diagrams describing an aligning operation performed on the basis of edge information for a pattern that exists in an overlapping region (case 3).

DESCRIPTION OF THE PREFERRED EMBODIMENTS

Figure 1:
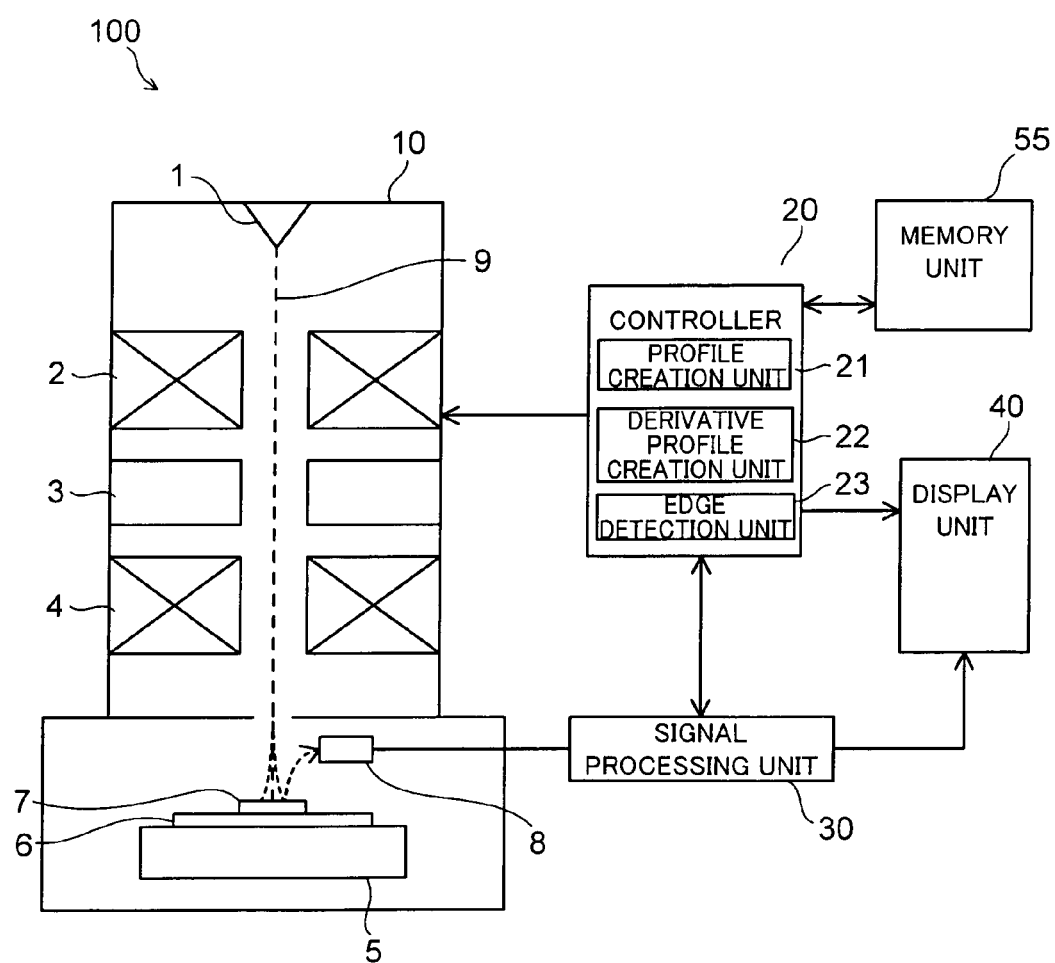
FIG. 1 is a diagram illustrating the configuration of a scanning electron microscope employed in an embodiment of the invention.

Some embodiments of the invention will be described below by referring to the drawings.

To begin with, a description will be given as to the configuration of a scanning electron microscope to be used as a mask inspection apparatus. Then, a description will be given as to how to measure the size of a pattern using a common SEM image. After that, a description will be given as to how to acquire a high-precision SEM image that covers a wide field of view.

(Configuration of Scanning Electron Microscope)

FIG. 1 is a diagram illustrating the configuration of a scanning electron microscope according to this embodiment.

This scanning electron microscope 100 is roughly divided into an electron scanning unit 10, a signal processing unit 30, a display unit 40, a memory unit 55, and a controller 20. The controller 20 controls the electron scanning unit 10, the signal processing unit 30, the display unit 40, and the memory unit 55. The controller 20 includes a profile creation unit 21, a derivative profile creation unit 22, and an edge detection unit 23.

The electron scanning unit 10 includes an electron beam gun 1, a condenser lens 2, a deflection coil 3, an objective lens 4, a movable stage 5, and a sample holder 6.

The electron beam gun 1 emits charged particles 9. The charged particles 9 pass through the condenser lens 2, the deflection coil 3, and the objective lens 4 before the charged particles 9 are irradiated on a sample 7 placed on the movable stage 5.

The charged particles 9 (primary electron beam) are irradiated on the sample 7 while the sample 7 is being scanned two-dimensionally. Secondary electrons emitted from the portion onto which the charged particles 9 are irradiated are detected by an electron detector 8 including a scintillator and the like. The quantity of the detected secondary electrons is converted into a digital quantity by an AD converter of the signal processing unit 30. The resultant digital quantity is stored in the memory unit 55 as image data. The image data are converted into a luminance signal to form an image displayed by the display unit 40. A two-dimensional digital image is obtained by arranging the image data in a two-dimensional array so that the image data are arranged in a two-dimensional array in conformity with the arrangement of positions scanned with the primary electron beam on the sample 7. Each picture element (pixel) of this two-dimensional digital image represents luminance data with an 8-bit information amount.

In addition, the signal processing unit 30 serves as an image processing unit to process image data, and executes an operation of synthesizing pieces of SEM images acquired respectively for divisional areas. A detailed description of this operation will be given later.

The controller 20 controls both the electron deflection quantity by the deflection coil 3 and the image scanning quantity of the display unit 40. In addition, the controller 20 stores programs related to the execution of the edge detection for patterns and to the execution of the operation of synthesizing the SEM images to form a single image that covers a wide field of view.

The profile creation unit 21 creates a line profile representing a luminance signal of data on the SEM image corresponding to a designated area. The line profile represents a luminance signal corresponding to the quantity of the secondary electrons.

The derivative profile creation unit 22 performs first-order differentiation on the line profile, and thus creates a first derivative profile.

The edge detection unit 23 detects edges of the patterns from the line profile and the first derivative profile.

(Measurement of Pattern Size Using Common SEM Image)

Subsequently, a description will be given as to how to measure the pattern size of the sample shown in FIG. 2A by use of the scanning electron microscope 100 shown in FIG. 1. The measurement of the pattern size uses an SEM image, and includes the edge detection of the pattern of the sample shown in FIG. 2A.

Figure 2A:
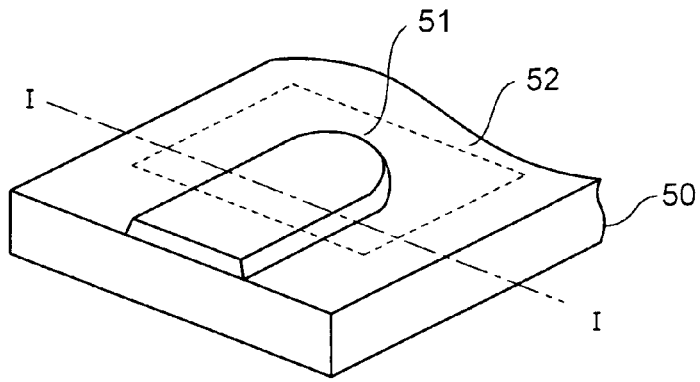
FIGS. 2A to 2D are diagrams describing an electron image and a profile acquired by a signal processing unit.

The sample 7 used as the target is a photomask substrate 50 with a wiring pattern 51 formed thereon, as shown in FIG. 2A. A portion of the sample 7 has a planar shape as shown in FIG. 2A. In FIG. 2A, the portion surrounded by dashed lines is a target area to be observed by the scanning electron microscope 100.

Figure 2B:
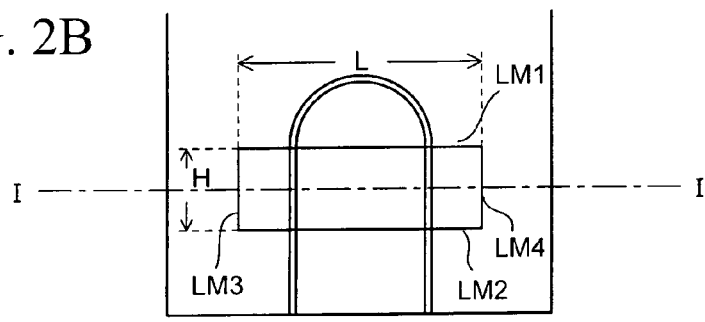

FIG. 2B shows an SEM image obtained in the following procedure. Firstly, a sample shown in FIG. 2A is scanned with electron beams to obtain secondary electrons. The quantity of electrons including the above-mentioned secondary electrons is detected by the electron detector 8. The detected quantity of electrons is converted into a luminance signal. An SEM image created on the basis of the luminance signal is displayed by a display apparatus (display unit 40) while the scanning with the electron beam and the scanning of the CRT of the display apparatus are being synchronized with each other.

An SEM image is extracted from the SEM image shown in FIG. 2B by designating a length measurement area. The length measurement area has, for example, a width H of 400 pixels and a length L. The operator selects the area by designating an upper-side line marker LM1, a lower-side line marker LM2, a left-side line marker LM3, and a right-side line marker LM4.

The extracted SEM image is divided in the width H direction of the length measurement area. From the pixel data of each divisional area, the line profile corresponding to the luminance distribution is acquired. When the line profile is acquired, a smoothing processing may be executed by, for example, 3-pixel width in the length L direction. With the smoothing processing, a noise component can be reduced.

Figure 2C:
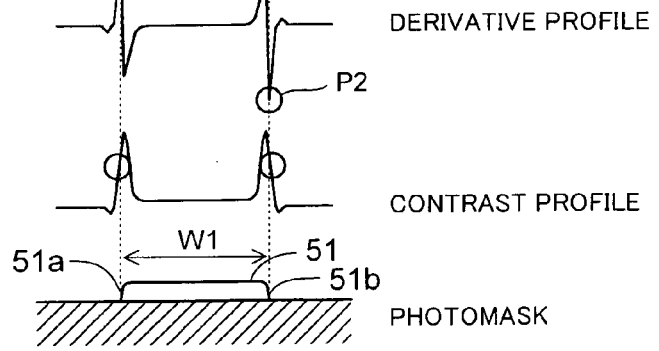

FIG. 2C is a diagram illustrating a line profile which corresponds to the quantity of the secondary electrons emitted from the sample when electron beams are irradiated along the line I-I of FIG. 2A. As FIG. 2C shows, the line profile (contrast profile) changes drastically in the edge portions of the pattern. To identify the positions of drastic change, the line profile is differentiated to obtain the maximum peak and the minimum peak of the quantity of the derivative signal.

Figure 2D:
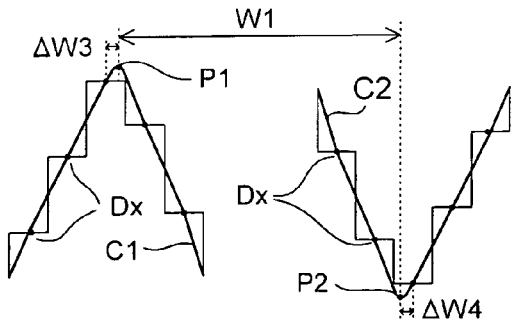

In addition, as FIG. 2D shows, derivative waveforms C1 and C2 are obtained by filling the gaps between pixels with plural derivative signals Dx around the peaks. The peak positions of a first peak P1 and of a second peak P2 are calculated at a resolution of $\frac{1}{100}$. The distance between the first peak P1 and the second peak P2 is obtained as a width W1 of the line pattern.

The above-described operation is executed for each of the divisional areas. The average of the widths of the patterns calculated respectively for all the divisional areas is defined as the length measurement value. In this way, the line-pattern width W1 can be obtained more precisely.

(Acquisition of High-Precision SEM Image Covering Wide Field of View)

Figure 3A:
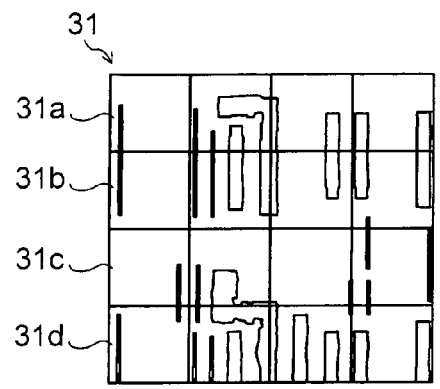
FIGS. 3A to 3C are diagrams describing the concept of a method of acquiring a high-precision SEM image that covers a wide field of view.
Figure 3B:
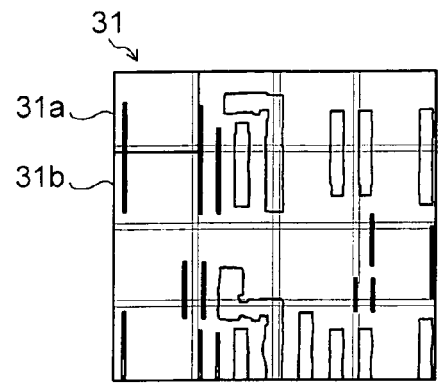
Figure 3C:
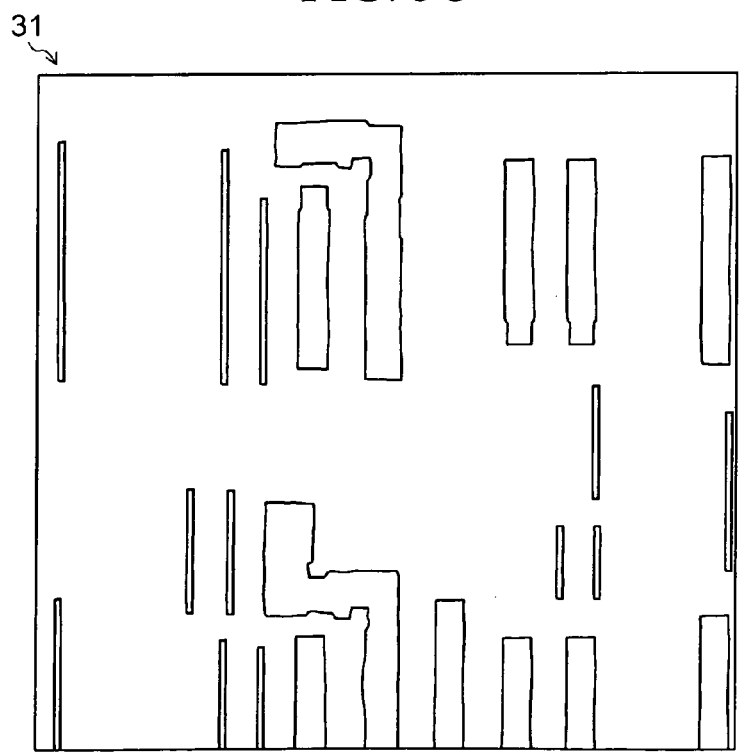

FIGS. 3A to 3C are diagrams describing the concept of a method of acquiring a high-precision SEM image that covers a wide field of view. FIG. 3A shows an example in which, among the patterns formed on the sample, an area 31 is designated as the desired area. To acquire an SEM image that covers the entire designated area 31, a single SEM image for the entire area 31 may be taken at a time. Alternatively, a joint SEM image may be acquired by dividing the designated area into plural divisional areas, then taking SEM images individually for the divisional areas, and then synthesizing the SEM images for the divisional areas.

If the single SEM image that covers the entire designated area is acquired at a time, the SEM image can be acquired in a short time. Nevertheless, if the area to be covered by the SEM image is wide, the farther away from the optical axis, the greater the aberrations become. As a consequence, the acquired SEM image has lower precision.

If a scanning electron microscope is used as a mask inspection apparatus, it is possible to check whether or not there are any defects such as discontinuities in the patterns formed on a mask by use of the acquired SEM image. Acquisition of a high-precision SEM image is necessary for the purpose of conducting high-precision inspection such as one involving the comparison of a simulation result of a mask with the pattern model. For this reason, in this embodiment, to acquire a high-precision SEM image that covers a wide area, the designated area is, firstly, divided into plural areas each of which is small enough to acquire a high-precision SEM image for the divisional area. Divisional SEM images are taken individually for the divisional areas, and then the divisional SEM images are synthesized to acquire an SEM image that covers a wide field of view.

FIG. 3A shows that the designated area 31 is divided into 16 divisional areas (31a, 31b, . . . ) so as to make it possible to acquire a high-precision SEM image for each of the divisional areas. Note that, in practice, as FIG. 3B shows, the division is done so as to make adjacent divisional areas partially overlap each other. In each divisional area, the portion that overlaps a portion of the adjacent divisional area will be referred to as an overlapping region. High-precision SEM images are acquired respectively for the divisional areas. The high-precision divisional SEM images are synthesized by executing an aligning operation using the coordinate data for each of the divisional areas and the edge information for patterns existing in the overlapping regions. Thus acquired is a high-precision SEM image that covers a wide field of view. FIG. 3C shows the SEM image thus acquired.

Figure 4:
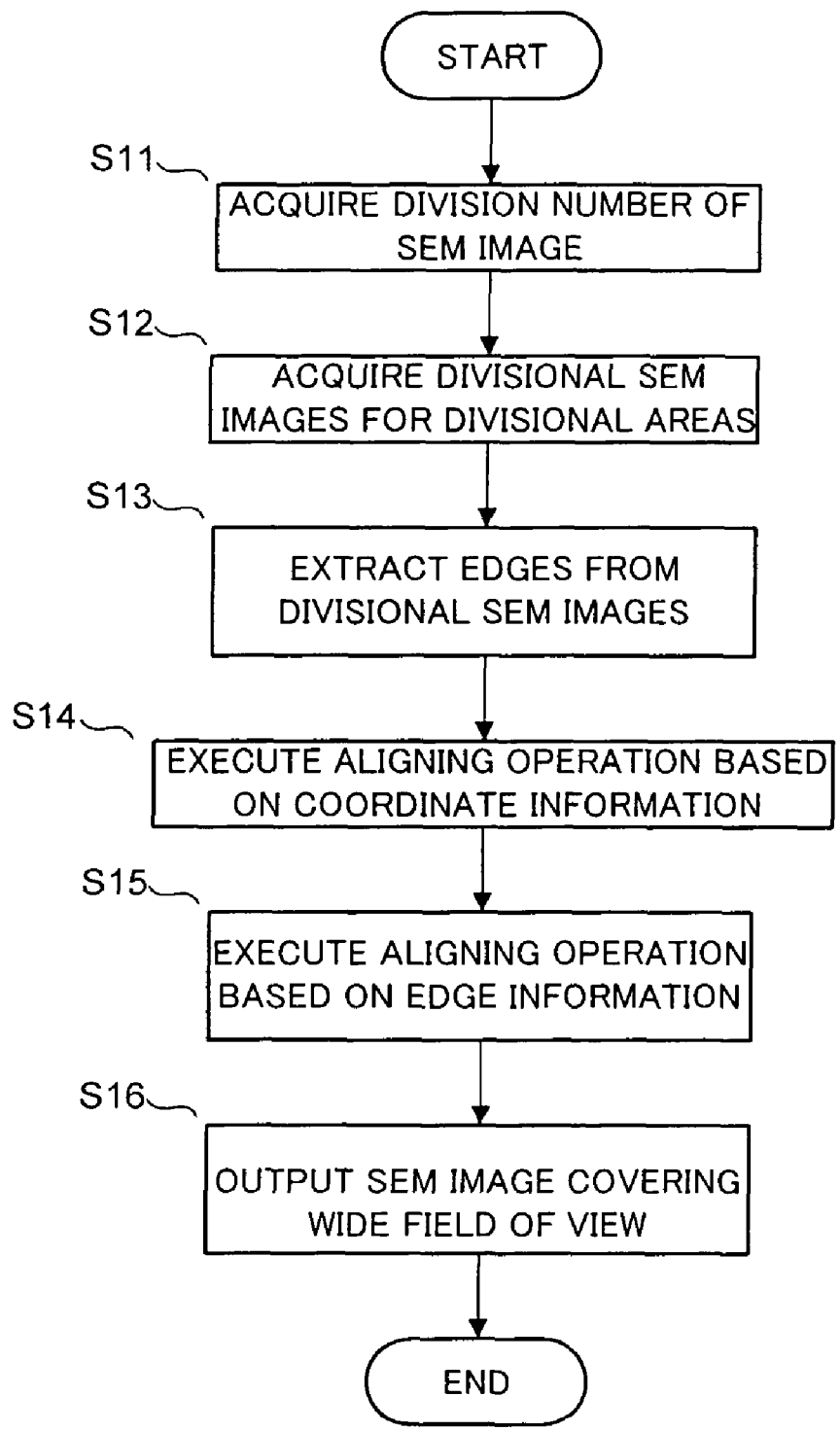
FIG. 4 is a flowchart illustrating an image acquisition operation to acquire a high-precision SEM image that covers a wide field of view.

FIG. 4 is a flowchart illustrating an image acquisition operation to acquire a high-precision SEM image that covers a wide field of view.

To begin with, as step S11, the number of divisional SEM images to be formed (hereafter, the number will be simply referred to as "division number") is acquired. After the user designates a desired area, the necessary division number is calculated from the size of the designated area and the area that is small enough to acquire a high-precision SEM image.

Subsequently, at step S12, SEM images are acquired respectively for the divisional areas formed by dividing the designated area by the division number calculated at step S11 (hereafter, the SEM images thus acquired will be referred to as the "divisional SEM images"). Note that when the designated area is divided, the divisional areas are defined so that each divisional area includes an overlapping region that overlaps a portion of the adjacent divisional area.

Subsequently, at step S13, edges of the pattern included in each divisional area are extracted from the corresponding divisional SEM image. The operation of extracting edges of the pattern will be described in detail later.

At the subsequent steps S14 and S15, the divisional SEM images are synthesized. At step S14, the divisional areas are synthesized through an aligning operation executed by referring to the coordinate information (i.e., coordinate data) for each of the divisional areas. Each divisional area has its own, unique coordinate data. In addition, the designated area has its own coordinate data (hereafter, the coordinate data for the designated area will be referred to as the "reference coordinate data"). The coordinate data of each divisional area are converted into the reference coordinate data. When adjacent divisional areas are joined together, the positions of the same coordinate data are aligned with each other. Thus the divisional SEM images are synthesized.

Subsequently, at step S15, another aligning operation is executed for the divisional areas on the basis of the edge information for the patterns. This aligning operation at step S15 is done for the purpose of fine-tuning the operation of synthesizing the divisional areas executed at step S14. The edge information used in the aligning operation at step S15 is the edge information for the patterns located in the overlapping regions between adjacent divisional areas. Specifically, the positions of the divisional areas are adjusted in the following way. Firstly, a pattern which exists in an overlapping region and which therefore is shared by the corresponding adjacent divisional areas (for example, the divisional areas DA11 and DA 12) is detected. Then, the edge information (i.e., the coordinates of edge position) for the pattern, which has already been extracted at step S13, is detected. The positions of the divisional areas DA 11 and DA12 are adjusted so that the edge position of the pattern located in the divisional area DA11 can coincide with the edge position of the pattern located in the divisional area DA12. To put it differently, the differences between coordinate data for the two divisional areas are firstly calculated. Then, if the coordinate data for the two divisional areas do not coincide with each other, the positions of the divisional areas are adjusted so that the differences can become zero.

The operations at steps S14 and S15 are executed for all the divisional areas. Thus acquired is a joint SEM image with the positions of all the divisional SEM images having been adjusted. The data for this joint SEM image are stored in the memory unit 55.

Subsequently, at step S16, the joint SEM image (an SEM image that covers a wide field of view) acquired at step S15 is outputted.

The above-described joint-image forming processing makes it possible to output a high-precision SEM image of the designated area of the mask even when the SEM image covers a wide field of view.

Subsequently, each of the operations described above will be described in detail. FIG. 5 shows diagrams describing coordinate data for the designated area and for the divisional areas.

Figure 5A:
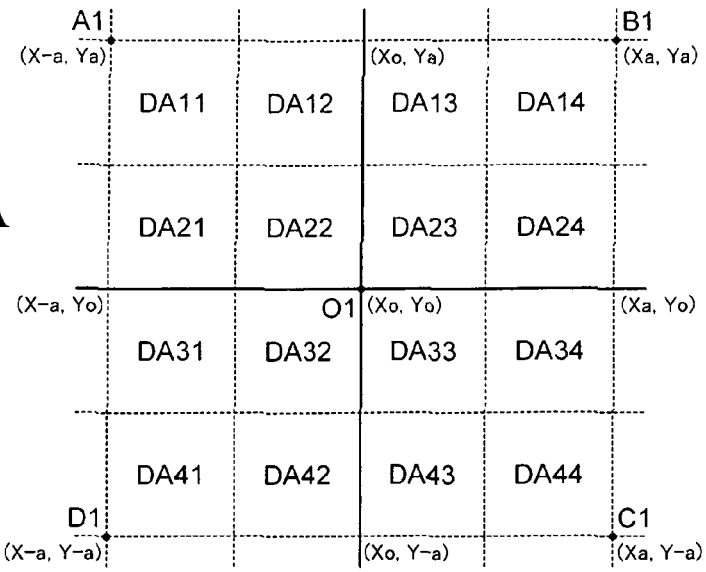
FIGS. 5A to 5D are diagrams describing the coordinate data for a designated area and for divisional areas.

FIG. 5A shows coordinate data of a case where a designated area is divided into 16 divisional areas. Each of these divisional areas DA11 to DA44 has an area that is small enough to allow a scanning electron microscope to acquire a high-precision SEM image.

As FIG. 5A shows, as the designated area, a rectangular area having a center point O1 (X0, Y0) is demarcated by connecting the following four points to one another: a point A1 (X–a, Ya), a point B1 (Xa, Ya), a point C1 (Xa, Y–a), and a point D1 (X–a, Y–a). Such coordinate data are held as the coordinate data for the designated area (i.e., reference coordinate data).

Figure 5B:
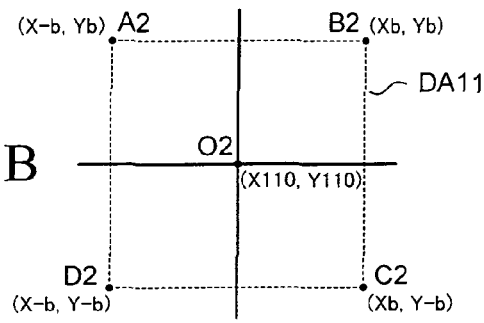
Figure 5C:
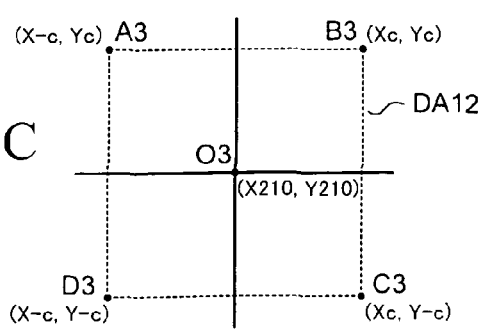

FIG. 5B corresponds to the divisional area DA11 shown in FIG. 5A whereas FIG. 5C corresponds to the divisional area DA21 shown in FIG. 5A. As FIG. 5B shows, the divisional area DA11 is a rectangular area having a center point O2 (X110, Y110) and being demarcated by connecting the following four points to one another: a point A2 (X–b, Yb), a point B2 (Xb, Yb), a point C2 (Xb, Y–b), and a point D2 (X–b, Y–b). Such coordinate data are held as the coordinate data for the divisional area DA11.

In addition, as FIG. 5C shows, the divisional area DA21 is a rectangular area having a center point O3 (X210, Y210) and being demarcated by connecting the following four points to one another: a point A3 (X–c, Yc), a point B3 (Xc, Yc), a point C3 (Xc, Y–c), and a point D3 (X–c, Y–c). Such coordinate data are held as the coordinate data for the divisional area DA21.

SEM images (divisional SEM images) are acquired respectively for these divisional areas DA11 to DA44, and then the divisional SEM images are synthesized. In this embodiment, the processing of synthesizing the SEM images for the divisional areas is executed by an aligning method having two stages. The aligning operation executed at the first stage is based on the coordinate data for the divisional areas whereas the aligning operation executed at the second stage is based on the edge information for the patterns existing in overlapping areas of the divisional areas.

To begin with, the aligning operation based on the coordinate data for the divisional areas will be described by referring to FIG. 5. As shown in, for example, FIGS. 5B and 5C, each of the divisional areas has its own unique coordinate data. The coordinate data are converted into the coordinates of the designated area (i.e., reference coordinate data) when SEM images are acquired. The aligning operation is executed so that the coordinate positions of the adjacent divisional areas can coincide with each other.

The two divisional areas DA11 and DA21 shown in FIG. 5A are adjacent to each other in the Y direction. The images for the two divisional areas DA11 and DA21 are synthesized so that the coordinates D2 of the divisional area DA11 and the coordinates A3 of the divisional area DA21 can coincide with each other and so that the coordinates C2 of the divisional area DA11 and the coordinates B3 of the divisional area DA21 can coincide with each other. To this end, for example, the coordinate data for each divisional area are converted into the reference coordinate data in the following way. The displacement quantity from the center coordinate position of the reference coordinate for the designated area to the center coordinate position for each divisional area is calculated, and then the coordinate system of each divisional area is converted into the coordinate system of the reference coordinate.

Figure 5D:
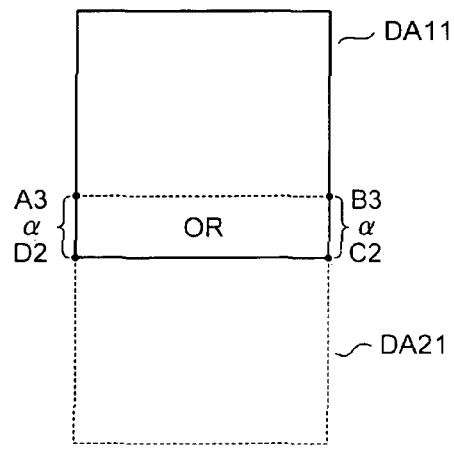

FIG. 5D is a diagram describing how to set up adjacent divisional areas. Specifically, FIG. 5D shows how to set up two divisional areas that are adjacent to each other in the Y direction. As FIG. 5D shows, each one of the two adjacent divisional areas includes a portion that overlaps a portion of the other one of the two adjacent divisional area (the overlapping portion will be referred to as the "overlapping region OR"). In this case, through an aligning operation based on coordinate information, the images of the two divisional areas are synthesized in the following way. The coordinates of the point whose y-coordinate is obtained by subtracting α from the y-coordinate of the point D2 belonging to the divisional area DA11 is made to coincide with the coordinates of the point A3 belonging to the divisional area DA21. In addition, the coordinate of the point whose y-coordinate is obtained by subtracting α from the y-coordinate of the point C2 belonging to the divisional area DA11 is made to coincide with the coordinates of the point B3 belonging to the divisional area DA21.

Figure 6:
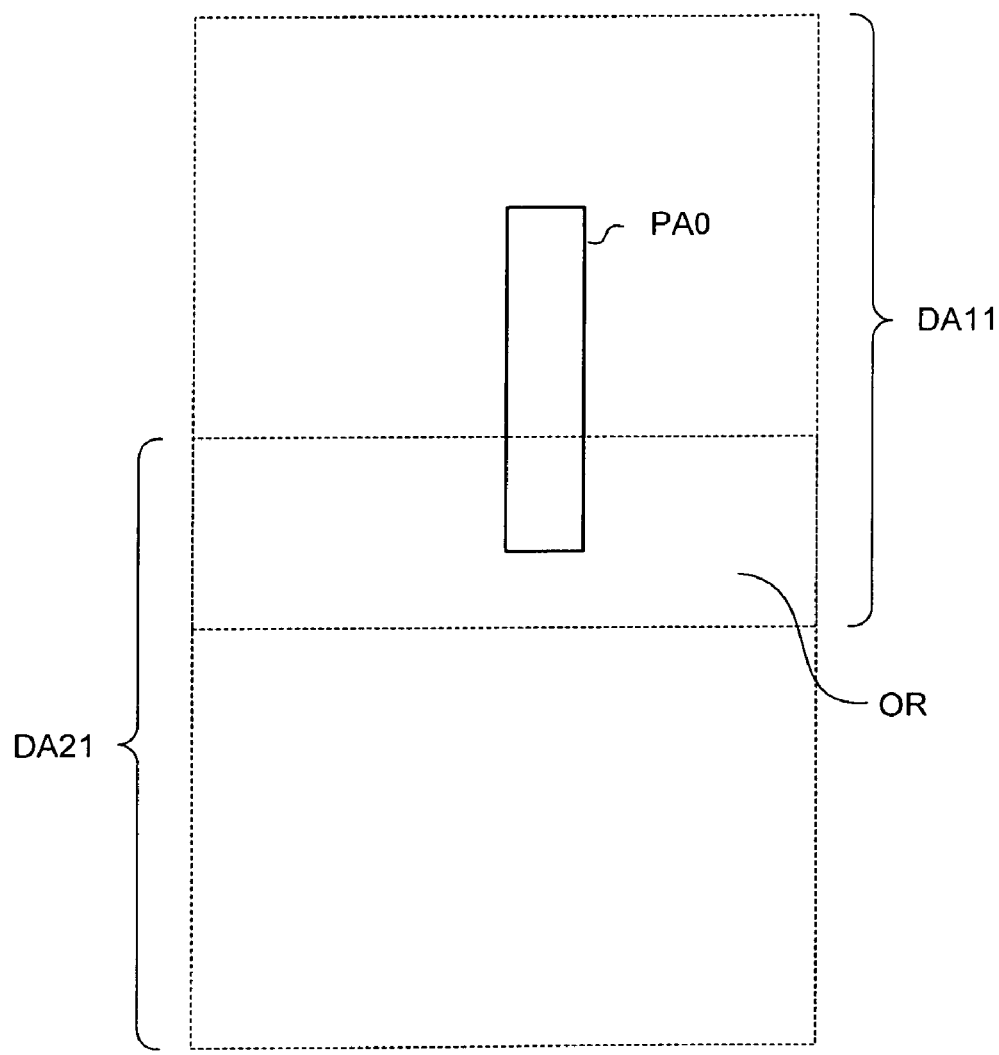
FIG. 6 is a diagram describing an aligning operation performed on the basis of edge information for a pattern that exists in an overlapping region (case 1).

Subsequently, the aligning operation based on the edge information for the patterns will be described by referring to FIG. 6. In the case shown in FIG. 6, the divisional areas DA11 and DA21 are adjacent to each other in the Y direction, and a pattern PA0 exists in an overlapping region OR belonging both of the divisional areas DA11 and DA21. The position of the pattern existing in the overlapping region OR is measured in each of the divisional areas DA11 and DA21. As to a pattern existing in an overlapping region, its position in one of the two divisional areas that are adjacent to each other always coincides with its position in the other of the two divisional areas. Accordingly, the same pattern belonging to both of the two divisional areas is extracted firstly, and then an aligning operation at the time of synthesizing the divisional SEM images is executed so that the coordinates of the edge positions for the same pattern calculated individually for the two divisional areas can be made to coincide with each other.

A method of synthesizing images in accordance with the shapes and/or the number of patterns existing in an overlapping region will be described below by referring to FIGS. 7 to 10.

Figure 7A:
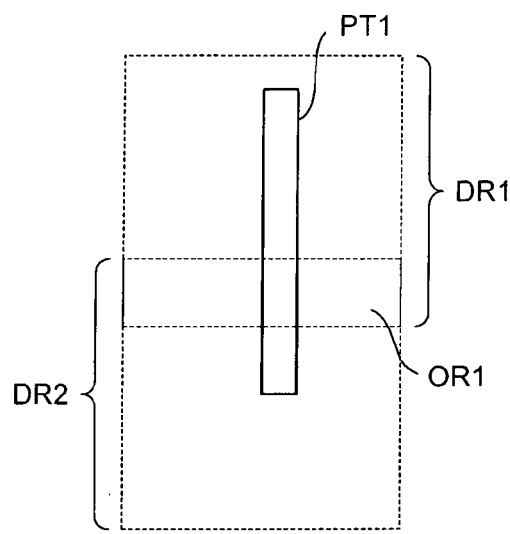
FIGS. 7A to 7E are a set of diagrams describing an aligning operation performed on the basis of edge information for a pattern that exists in an overlapping region (case 2).
Figure 7B:
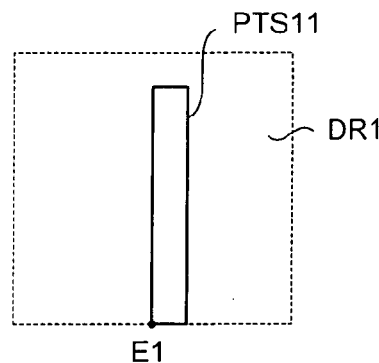
Figure 7C:
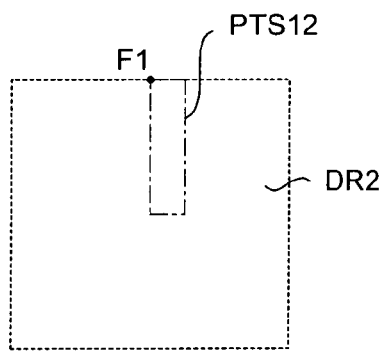

(1) Case of Pattern Belonging to Both of Adjacent Divisional Regions in Y Direction FIG. 7A shows an exemplar case where a pattern PT1 belongs to both of divisional regions DR1 and DR2. FIG. 7B shows an SEM image acquired for the divisional region DR1 whereas FIG. 7C shows an SEM image acquired for the divisional region DR2. As FIG. 7B shows, an SEM image PTS11 of the pattern PT1 is in contact with the border (lower-side line) portion of the divisional region DR1. Edge positions are detected by analyzing this SEM image PTS11. Likewise, edge positions are detected by analyzing an SEM image PTS12 of the pattern PT1 shown in FIG. 7C.

Figure 7D:
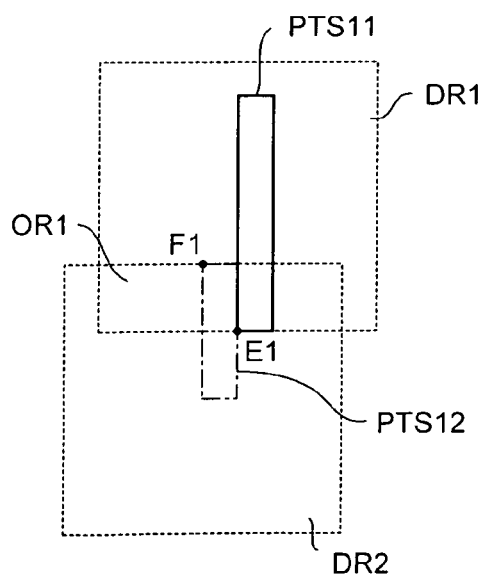

FIG. 7D shows the result of an operation of aligning these divisional regions DR1 and DR2 on the basis of the coordinate information. If the coordinate information includes no errors, there occurs no misalignment between the two SEM images of the same pattern PT1 that belongs to both of the divisional regions DR1 and DR2. In contrast, if the coordinate information includes errors, misalignment between the two SEM images of the pattern PT1 occurs as FIG. 7D shows. For this reason, a more precise aligning operation for the two divisional regions is executed using the edge information of the pattern PT1 measured for each of the two divisional regions with high precision.

Figure 7E:
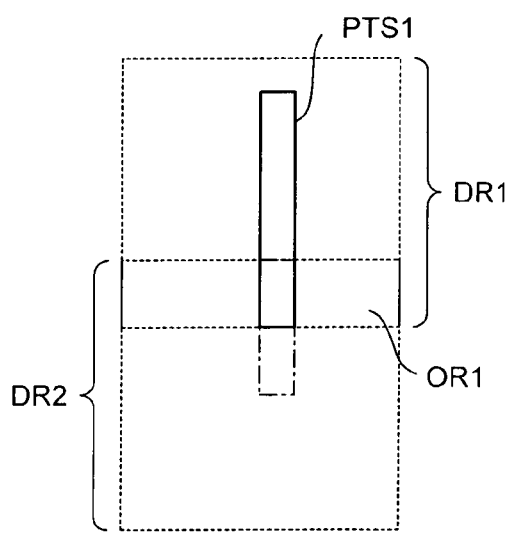

Through an aligning operation based on the coordinate data, the pattern PT1 is selected as a common pattern included in both of the two divisional regions. SEM images of the pattern PT1 are acquired respectively for the two divisional regions, and the SEM images are used for obtaining the coordinates of the edge positions. The values of the coordinates for each of the two divisional regions are corrected so that the coordinates for the edge positions in one of the two divisional regions can be coincide with their respective counterparts in the other one of the two divisional regions. In the case shown in FIG. 7D, the two divisional regions are displaced relative to each other in the x direction. The x-coordinate of an edge position E1 which is in contact with the border between the two divisional regions is calculated from the SEM image PTS11. In addition, the x-coordinate of an edge position F1 which is in contact with the border between the two divisional regions is calculated from the SEM image PTS12. Then, the difference between the x-coordinate for the edge position E1 and the x-coordinate for the edge position F1 is calculated. The coordinate data for the divisional regions DR1 and DR2 are adjusted so that the above-mentioned difference can become zero. FIG. 7E shows the result of synthesizing the two divisional regions with their coordinate data corrected.

(2) Case of Pattern Belonging to Both of Adjacent Divisional Regions in X Direction FIG. 8A shows an exemplar case where a pattern PT2 belongs to both of divisional regions DR3 and DR4. FIG. 8B shows an SEM image acquired for the divisional region DR3 whereas FIG. 8C shows an SEM image acquired for the divisional region DR4. As FIG. 8B shows, an SEM image PTS21 of the pattern PT2 is in contact with the border (right-side line) portion of the divisional region DR3. Edge positions are detected by analyzing this SEM image PTS21. Likewise, edge positions are detected by analyzing an SEM image PTS22 of the pattern PT2 shown in FIG. 8C.

FIG. 8D shows the result of an operation of aligning these divisional regions DR3 and DR4 on the basis of the coordinate information. If the coordinate information includes no errors, there occurs no misalignment between the two SEM images of the same pattern PT2 that belongs to both of the divisional regions DR3 and DR4. In contrast, if the coordinate information includes errors, misalignment between the two SEM images of the pattern PT2 occurs as FIG. 8D shows. For this reason, a more precise aligning operation for the two divisional regions is executed using the edge information of the pattern PT2 measured for each of the two divisional regions with high precision.

Through an aligning operation based on the coordinate data, the pattern PT2 is selected as a common pattern included in both of the two divisional regions. SEM images of the pattern PT2 are acquired respectively for the two divisional regions, and the SEM images are used for obtaining the coordinates of the edge positions. The values of the coordinates for each of the two divisional regions are corrected so that the coordinates for the edge positions in one of the two divisional regions can be coincide with their respective counterparts in the other one of the two divisional regions. In the case shown in FIG. 8D, the two divisional regions are displaced relative to each other in the y direction. The y-coordinate of an edge position G1 which is in contact with the border between the two divisional regions is calculated from the SEM image PTS21. In addition, the y-coordinate of an edge position H1 which is in contact with the border between the two divisional regions is calculated from the SEM image PTS22. Then, the difference between the y-coordinate for the edge position G1 and the y-coordinate for the edge position H1 is calculated. The coordinate data for the divisional regions DR3 and DR4 are adjusted so that the above-mentioned difference can become zero. FIG. 8E shows the result of synthesizing the two divisional regions with their coordinate data corrected.

Figure 9A:
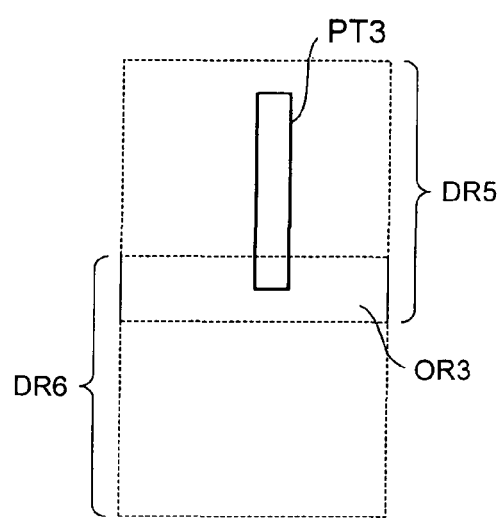
FIGS. 9A to 9E are a set of diagrams describing an aligning operation performed on the basis of edge information for a pattern that exists in an overlapping region (case 4).
Figure 9B:
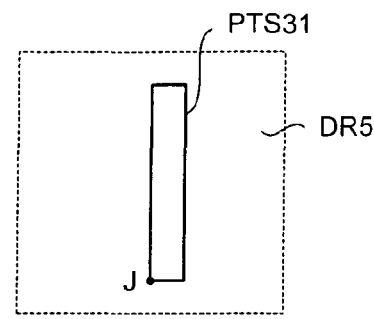
Figure 9C:
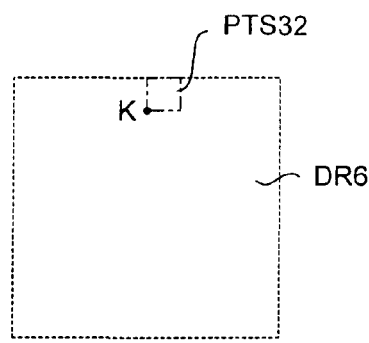

(3) Case of End Portion of Pattern Existing in Overlapping Region of Two Adjacent Divisional Regions FIG. 9A shows an exemplar case where a pattern PT3 belongs to both of divisional regions DR5 and DR6, and, at the same time, an end portion of the pattern PT3 exists in an overlapping region OR3. FIG. 9B shows an SEM image acquired for the divisional region DR5 whereas FIG. 9C shows an SEM image acquired for the divisional region DR6. As FIG. 9B shows, an SEM image PTS31 of the pattern PT3 is included in the divisional region DR5. Edge positions are detected by analyzing this SEM image PTS31. Likewise, edge positions are detected by analyzing an SEM image PTS32 of the pattern PT3 shown in FIG. 9C.

Figure 9D:
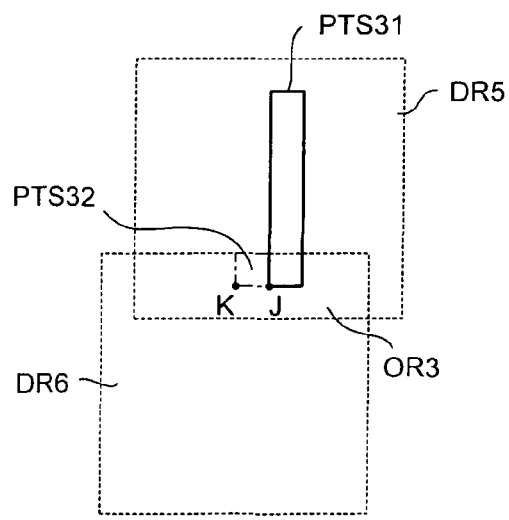

FIG. 9D shows the result of an operation of aligning these divisional regions DR5 and DR6 on the basis of the coordinate information. If the coordinate information includes no errors, there occurs no misalignment between the two SEM images of the same pattern PT3 that belongs to both of the divisional regions DR5 and DR6. In contrast, if the coordinate information includes errors, misalignment between the two SEM images of the pattern PT3 occurs as FIG. 9D shows. For this reason, a more precise aligning operation for the two divisional regions is executed using the edge information of the pattern PT3 measured for each of the two divisional regions with high precision.

Figure 9E:
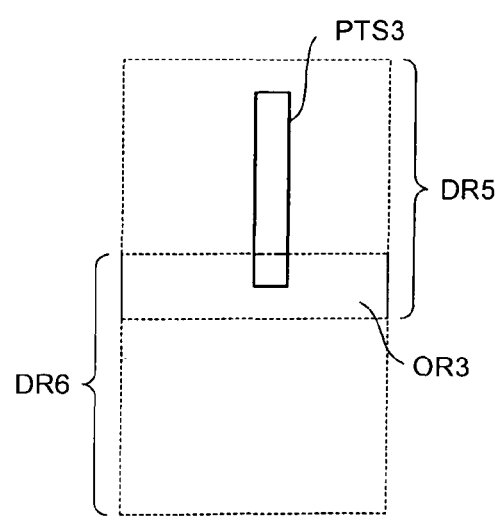

Through an aligning operation based on the coordinate data, the pattern PT3 existing in the overlapping region OR3 is selected as a common pattern included in both of the two divisional regions. SEM images of the pattern PT3 are acquired respectively for the two divisional regions, and the SEM images are used for obtaining the coordinates of the edge positions. The values of the coordinates for each of the two divisional regions are corrected so that the coordinates for the edge positions in one of the two divisional regions can be coincide with their respective counterparts in the other one of the two divisional regions. The values of the coordinates of an edge position J of the pattern PT3 is calculated from SEM image PTS31. In addition, the values of the coordinates of an edge position K of the pattern PT3 is calculated from the SEM image PTS32. Then, the differences between the values of the edge position J and the corresponding values of the edge position K are calculated. The coordinate data for the divisional regions DR5 and DR6 are adjusted so that the above-mentioned differences can become zero. In the case shown in FIG. 9D, the two divisional regions DR5 and DR6 are displaced relative to each other in the x direction. It is, however, possible to adjust the misalignment on the basis of the coordinates of the edge positions J and K even if the two divisional regions DR5 and DR6 are displaced relative to each other both in the x direction and in the y direction. FIG. 9E shows the result of synthesizing the two divisional regions with their coordinate data corrected.

Figure 10A:
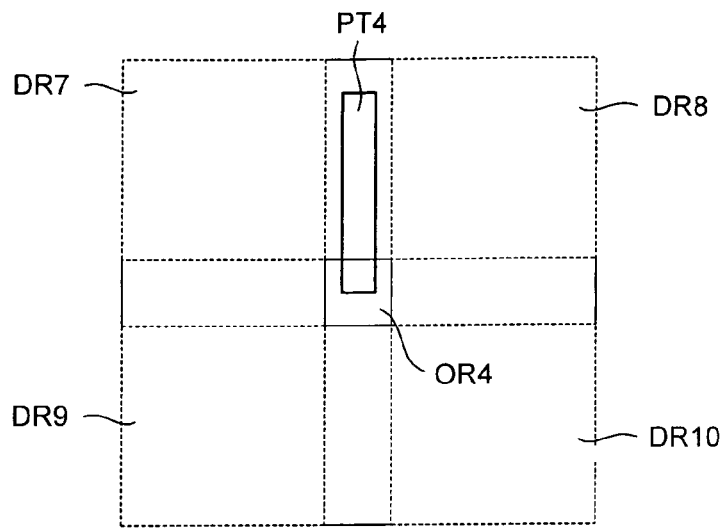
FIGS. 10A to 10C are a set of diagrams describing an aligning operation performed on the basis of edge information for a pattern that exists in an overlapping region (case 5).

(4) Case of Pattern Existing in Overlapping Region of Four Adjacent Divisional Regions FIG. 10A shows an exemplar case where a pattern PT4 is included in the divisional regions DR7 to DR10, and, at the same time, an end portion of the pattern PT4 exists in an overlapping region OR4.

Figure 10B:
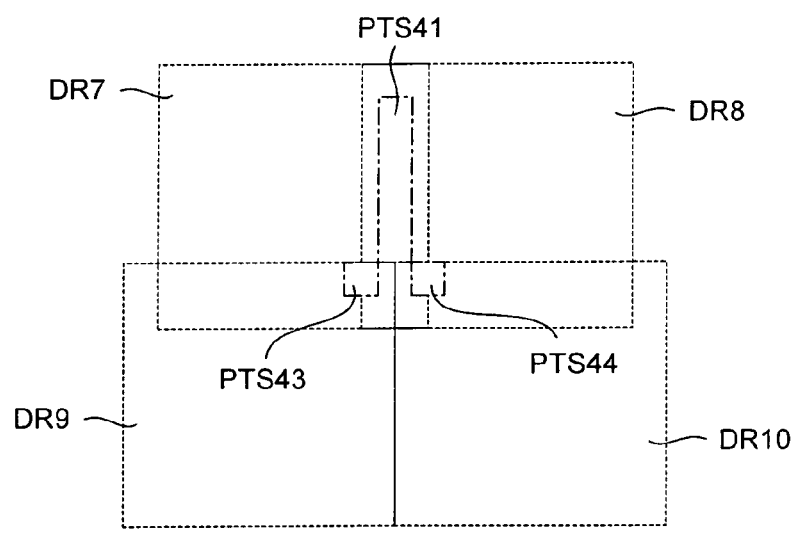
Figure 10C:
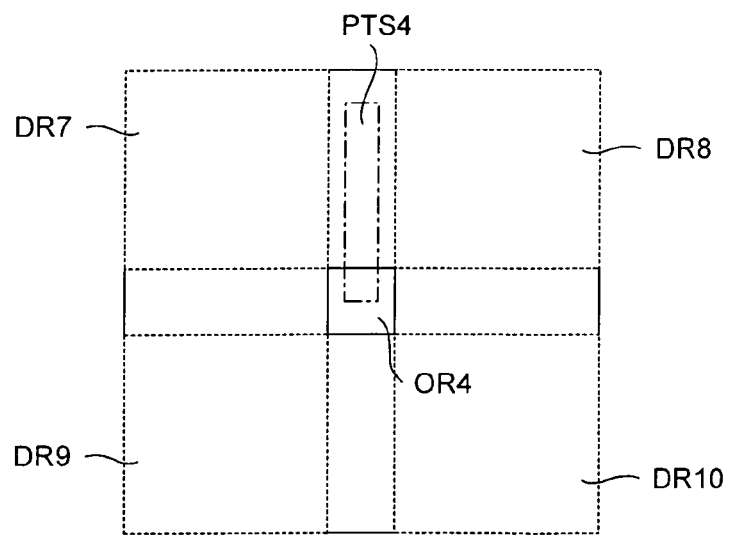

FIG. 10B shows the result of an operation of aligning these divisional regions DR7 to DR10 on the basis of the coordinate information. In this example, there are no errors between the coordinate positions of the divisional regions DR7 and DR8. There are, however, errors between the x-coordinate in the coordinate data for the divisional region DR7 and the x-coordinate in the coordinate data for the divisional region DR9. In addition, there are errors between the x-coordinate in the coordinate data for the divisional region DR8 and the x-coordinate in the coordinate data for the divisional region DR10.

Through an aligning operation based on the coordinate data, the pattern PT4 existing in the overlapping region OR4 is selected as a common pattern included in all of the four divisional regions. The values of the coordinates for each of the four divisional regions are corrected so that the coordinates for the edge positions of the end portion of the pattern PT4 in all of the four divisional regions can be coincide with one another.

Through this correction, the aligning operation for the four adjacent divisional regions is executed. When an aligning operation for four adjacent divisional regions is executed as in the above-described example, and if the division number is (n×n), the aligning-operation processing using edge positions of a pattern has to be executed (n−1)×(n−1) times for the purpose of executing the correction of the coordinate values.

In the foregoing description, how to execute the aligning operation based on the edge information is described for the four cases, but these are not the only possible cases. Alternatively, the aligning operation based on the edge information may be executed by detecting the edges of all the patterns existing in the overlapping region.

Suppose a case where a first divisional region has a second divisional region that is adjacent to the first divisional region in the X direction, and a third divisional region that is adjacent to the first divisional region in the Y direction. In this case, the aligning operation based on the edge information for the patterns existing in the overlapping region may be executed in the following way. Firstly, the number of patterns existing in the overlapping region in the X direction is compared with the number of patterns existing in the overlapping region in the Y direction. Edge information is acquired for the patterns existing in the overlapping region that has more patterns. The Edge information thus acquired is used for executing the aligning operation.

To execute the above-described aligning operation based on the edge information for the patterns, it is necessary to detect, with high precision, the edges of the patterns existing in the overlapping region. The edge detection in this embodiment is executed with precision of $1/100$ pixels.

An operation of detecting edges on the contour of a pattern will be described below by taking a pattern having a shape shown in FIG. 11 as an example and by referring also to FIGS. 12 and 13. FIG. 12 is a flowchart illustrating an exemplar operation to detect edge positions on the contour of a pattern. FIG. 13 shows diagrams describing how the edges on the contour of a pattern are detected. Note that the detection of the edge positions on the contour of a pattern starts from a predetermined position (which will be referred to as a "start position ES").

To begin with, the setting is initialized at step S21 of FIG. 12. The edges on the contour of the pattern are detected at predetermined intervals, which are designated in this initial setting operation (hereafter, the distance of each interval will be referred to as the "designated step"). For example, the designated step may be set at a distance corresponding to a predetermined number of pixels. In addition, a counter k representing the position of the currently-detecting edge on the contour of the pattern is set at zero in this initialization at step S21.

At the subsequent steps S22 to S24, the edge position that is away from the start position ES by a predetermined designated step d is detected.

Figure 13A:
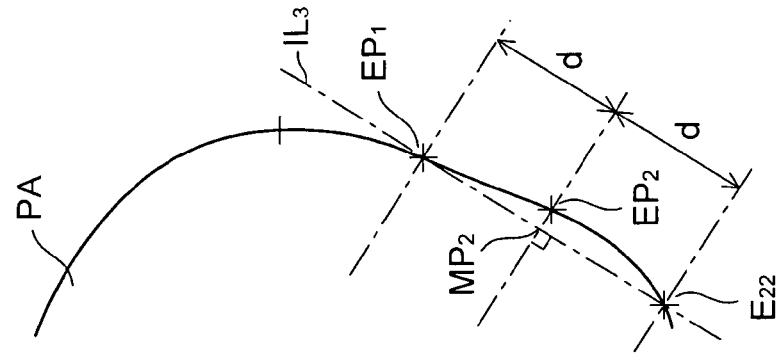
FIGS. 13A to 13D are diagrams describing a method of detecting edge positions on the contour of a pattern.

At step S22, a tentative edge is detected at a position that is away from the start position ES by a distance of (designated step d×2). Specifically, as FIG. 13A shows, a straight line VL is drawn downwards (in the −Y direction) in FIG. 13A from the start position ES, and another straight line HL is drawn in a way to intersect the line VL at right angles at a position that is away from the start position ES by a distance (designated step d×2). Using the line HL as the reference line for forming the profile, a line profile is formed and then an edge $E_{11}$ is detected. The edge $E_{11}$ thus detected will be referred to as a tentatively-detected edge $E_{11}$. Note that, in the example shown in FIG. 13A, the edge is detected at a position away from the start position ES in the −Y direction. Alternatively, if the shape of the target pattern requires, the edge detection may be done at a position away from the start position ES in the X directions.

Subsequently, at step S23, the tentatively-detected edge $E_{11}$ that has been detected at step S22 is detected once again. A straight line is drawn from the start position ES towards the tentatively-detected edge position $E_{11}$, and a second straight line is drawn so that the two lines intersect each other at right angles at a position that is away from the start position ES by a distance of (designated step d×2). Using this second line as the reference line for forming the profile, a line profile on this reference line is obtained, and then the tentatively-detected edge position is detected once again. This re-detection of the tentatively-detected edge position makes the distance from the start position ES become closer to a distance of (designated step d×2).

Figure 13B:
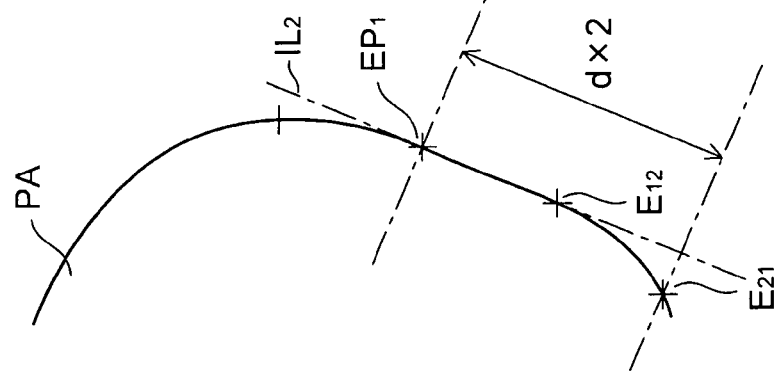
Figure 13C:
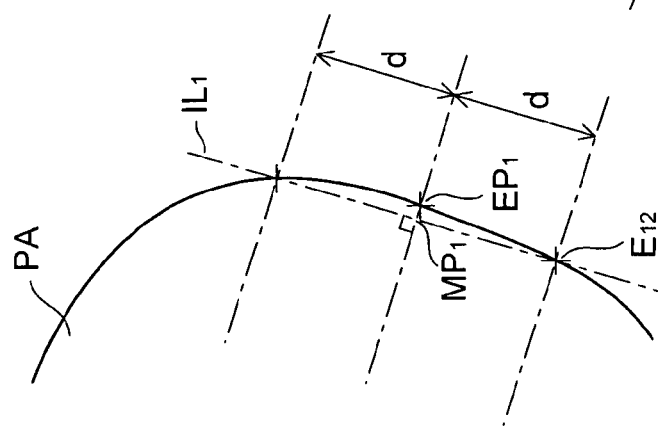
Figure 13D:
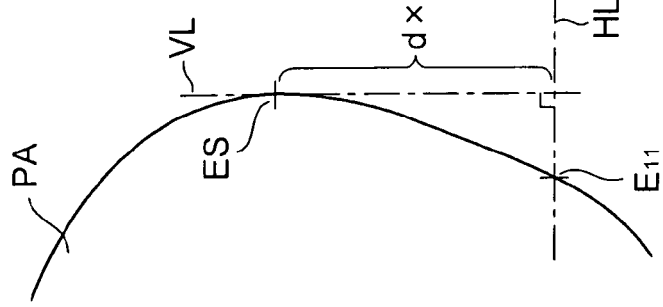

Subsequently, at step S24, a first edge position is detected. A straight line $IL_1$ is drawn so as to connect the start position ES to the re-detected tentatively-detected edge position $E_{12}$. A second straight line passing on a middle position $MP_1$ is drawn in a way to intersect the line $IL_1$ at right angles. The line profile is obtained on this second line, and then an edge $EP_k$ $(x_k, y_k)$ is detected. FIG. 13B shows that an edge $EP_1$ is detected as the first edge. This way of detecting the edge $EP_k$ $(x_k, y_k)$ allows the edge to be detected on a line intersecting the contour of the pattern at an angle that is close to a right angle. Consequently, edge positions can be detected more precisely.

Subsequently, at step S25, the edge $EP_k$ $(x_k, y_k)$ is used as the start point for the next edge detection. In the example shown in FIG. 13C, the edge $EP_1$ is used as the starting point.

At the subsequent steps S26 to S28, a detection is executed for an edge position $EP_{k+1}$ $(x_{k+1}, y_{k+1})$ that is away from the starting position (i.e., the edge position $EP_k$ $(x_k, y_k)$) by a distance of the designated step.

At step S26, a straight line $IL_2$ is drawn so as to connect the start point $EP_1$ to a re-detected tentatively-detected edge $E_{12}$. A second straight line is drawn in a way to intersect the line $IL_2$ at right angles at a position away from the start point $EP_1$ located on the line $IL_2$ by a distance of (designated step d×2). Using this second line as the reference line for forming the profile, a line profile is formed, and then an edge is detected. The edge thus detected will be referred to as a "tentatively-detected edge $E_{21}$."

At the subsequent step S27, in a similar manner to that of step S24, a first line is drawn so as to connect the start point $EP_1$ to the tentatively-detected edge position $E_{21}$. A second line is drawn so that the two lines intersect each other at right angles at a position away from the start point EP1 by a distance of (designated step d×2). Using this second line as the reference line for forming the profile, the line profile on this reference line is obtained, and then the tentatively-detected edge position is detected once again.

Subsequently, at step S28, a straight line $IL_3$ is drawn so as to connect the start point $EP_1$ to the re-detected tentatively-detected edge position $E_{22}$. A second straight line is drawn in a way to intersect the line $IL_3$ at right angles at a middle position $MP_2$. A line profile is obtained on this second line, and an edge $EP_{k+1}$ is detected. In the example shown in FIG. 13D, an edge $EP_2$ is detected as the second edge.

Subsequently, at step S29, a determination is executed as to whether all the edges on the contour of the pattern have already been detected or not. If the determination concludes that all the edges have already been detected, the series of processes are finished. If, conversely, the determination concludes that there still remain some edges to be detected, another process described at step S30 and the subsequent processes will be executed.

At the step S30, the value of the counter k is set at k+1, and then the next edge position is detected at the subsequent step S25.

Figure 11:
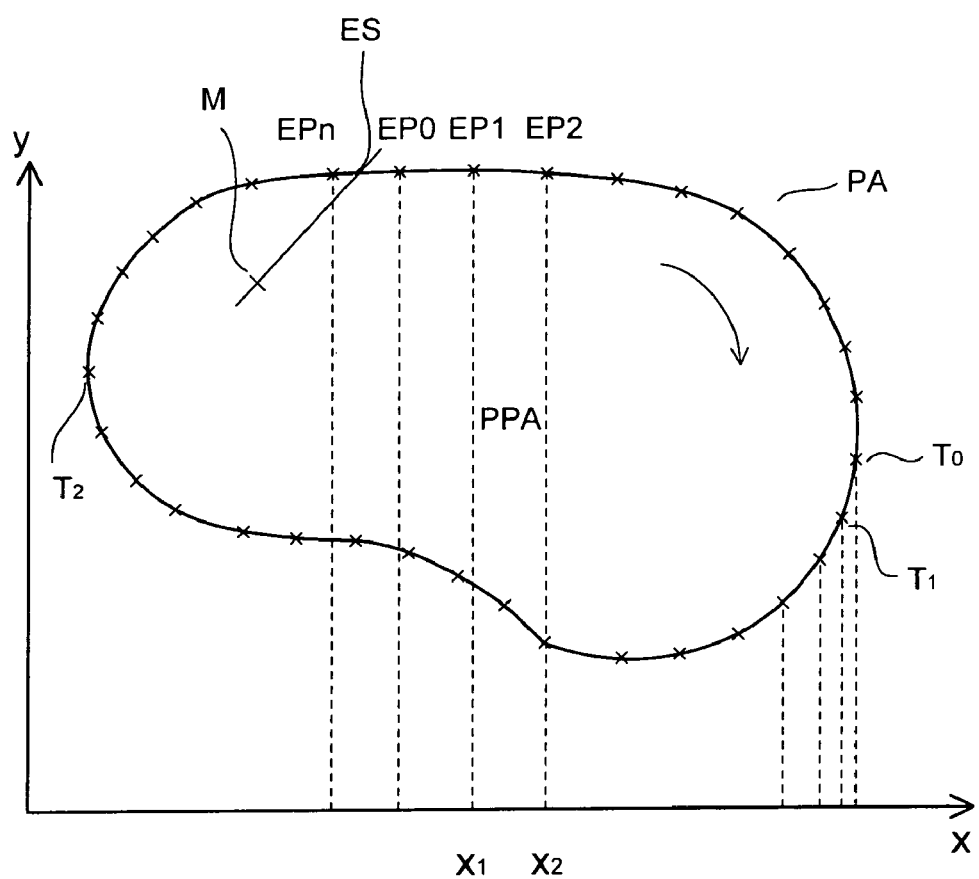
FIG. 11 is a diagram describing a method of measuring edges of a pattern.
Figure 12:
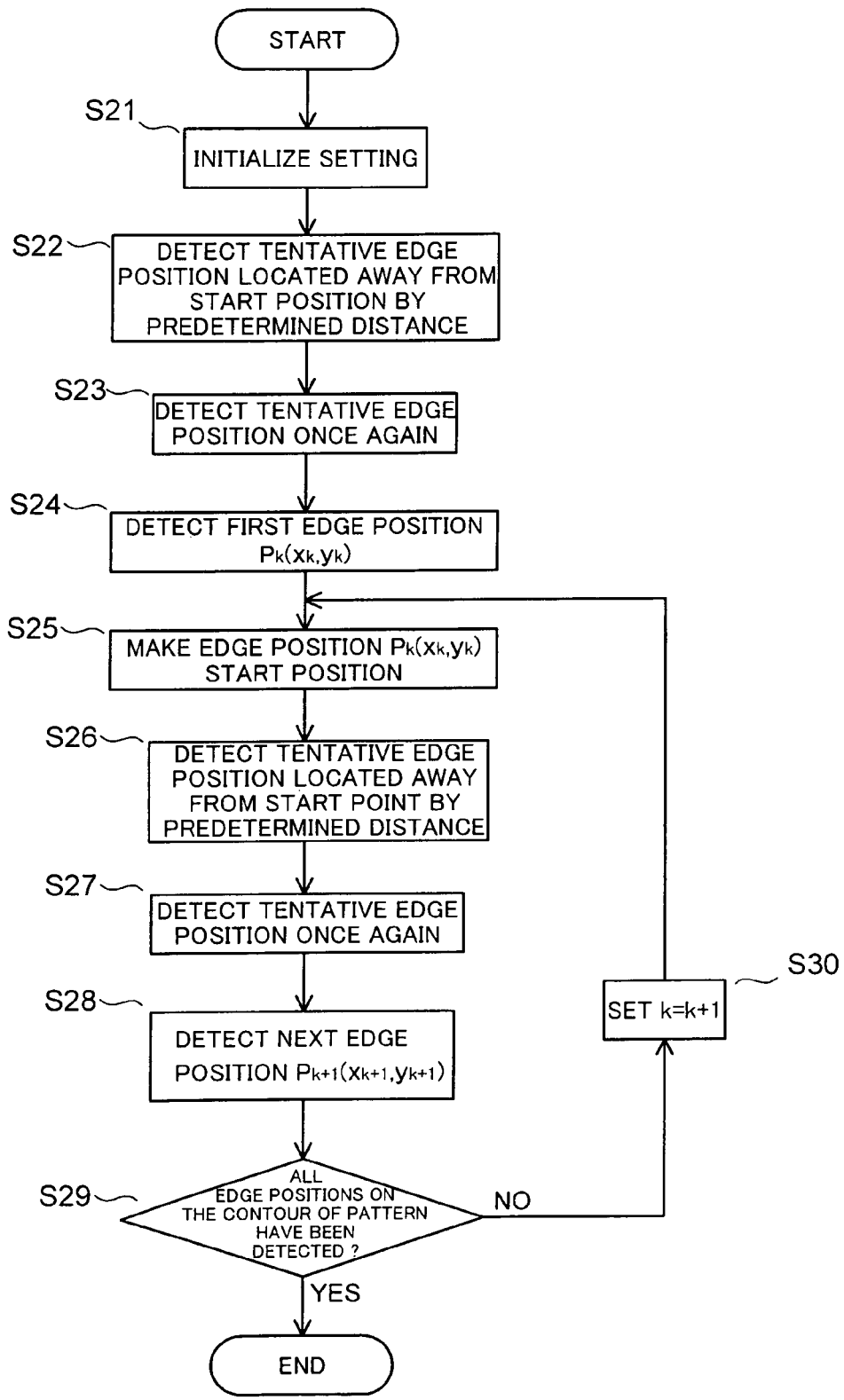
FIG. 12 is a flowchart illustrating an operation to detect edge positions on the contour of a pattern.

By the above-described series of processes, edge positions $EP_0, EP_1, \ldots$ on the contour of the pattern are detected one by one as FIG. 11 shows. In this way, when the edges on the contour of the pattern are detected, a first straight line is firstly drawn so as to connect the detected edge position to a tentative edge position away from the detected edge position by a predetermined distance. Then, a second straight line is drawn in a way to intersect the first line at right angles at the middle position between the detected edge position and the tentative edge position. From the line profile formed on the second line, the subsequent edge position is detected. This way of edge detection allows each edge to be detected on a line intersecting the contour of the pattern at an angle that is close to a right angle. Consequently, edge positions can be detected more precisely.

As has been described thus far, in this embodiment, the designated observation area of the sample is divided into the plural divisional areas so that the adjacent divisional areas can partially overlaps each other. Then, the high-precision SEM images are acquired respectively for the divisional areas. When the divisional areas are synthesized, the operation of aligning the divisional areas is firstly executed on the basis of the coordinate information for the divisional areas. Then, on the basis of the edge information for the patterns existing in the overlapping regions of the divisional areas, the operation of aligning the divisional areas with higher precision is executed. The SEM images of the divisional areas are synthesized through the aligning operations. Accordingly, an SEM image of the designated area is acquired so as to cover a wide field of view.

In this way, the designated wider area is divided into smaller areas, and then SEM images are acquired individually for the smaller divisional areas. Accordingly, high-precision SEM images can be acquired. In addition, the coordinate positions are corrected using not only the coordinate information for the divisional areas but also the edge information for the patterns each of which exists across the adjacent divisional areas. Accordingly, the SEM images can be synthesized with higher precision. Consequently, an SEM image that covers a wide field of view can be acquired with higher precision.

Note that general data stream (GDS) data may be generated from the data of the SEM image that covers a wide field of view, and be fed back to a mask-design simulator, where the feedback data is compared with the design data so as to check whether there are or are not any defects in the mask patterns.

What is claimed is:

1. A mask inspection apparatus comprising:

emitting unit for emitting electron beams onto a sample;

electron detecting unit for detecting the quantity of electrons produced, by the emission of the electron beams, from the sample with patterns formed thereon;

image processing unit for generating image data for the patterns on the basis of the quantity of electrons; and controlling unit for controlling the emitting unit, the electron detecting unit, and the image processing unit, wherein the controlling unit calculates, from the size of a designated observation area of the sample, a division number of divisional images that are synthesized to form a joint image that covers an entire designated observation area, the controlling unit determines divisional areas so that adjacent divisional images partially overlap each other, the controlling unit acquires SEM images for the respective divisional areas, and the controlling unit synthesizes the SEM images of the divisional areas on the basis of coordinate data for the divisional areas and on the basis of edge information for patterns included in the overlapping regions, and thereby creates an SEM image of a wide field of view that covers the observation area.

2. The mask inspection apparatus according to claim 1, wherein data on the SEM image of each of the divisional areas include coordinate data for the divisional area, the controlling unit converts the coordinate data into coordinate data for the designated observation area, and the controlling unit synthesizes the SEM images of the adjacent divisional areas on the basis of the converted coordinate data for the divisional areas.

3. The mask inspection apparatus according to claim 2, wherein the controlling unit detects a pattern included in an overlapping region where portions of adjacent divisional areas overlap each other, and the detected pattern is used as a pattern for an aligning operation, the controlling unit detects an edge of the pattern in each of the divisional areas with precision of $1/100$ pixels, the controlling unit corrects the coordinate data of the divisional areas so that the difference between an edge position of the pattern in one of the divisional areas and the corresponding edge position of the pattern in another one of the divisional areas becomes zero.

4. The mask inspection apparatus according to claim 3, wherein the controlling unit detects a first overlapping region of a first divisional area with a second divisional area that is adjacent to the first divisional area in an X direction, and detects a second overlapping region of the first divisional area with a third divisional area that is adjacent to the first divisional area in a Y direction, the controlling unit detects patterns included in the first overlapping region and patterns included in the second overlapping region, and selects, as the patterns for the aligning operation, patterns of one having more patterns among the first overlapping region and the second overlapping region.

5. The mask inspection apparatus according to claim 3, wherein the controlling unit detects an overlapping region shared by four of the divisional areas, and the controlling unit selects a pattern included in the overlapping region as a pattern for the aligning operation.

6. An image creation method for a mask inspection apparatus that includes: emitting unit for emitting electron beams onto a sample; electron detecting unit for detecting the quantity of electrons produced, by the emission of the electron beams, from the sample with patterns formed thereon; and image processing unit for generating image data for the patterns on the basis of the quantity of electrons, the image creation method comprising the steps of:

calculating, from the size of a designated observation area of the sample, a division number of divisional images that are synthesized to form a joint image that covers an entire designated observation area;

determining divisional areas so that adjacent divisional images partially overlap each other;

acquiring SEM images for the respective divisional areas;

executing a first operation of aligning the divisional areas on the basis of coordinate data for the divisional areas;

executing a second operation of aligning the divisional areas on the basis of edge information for patterns included in the overlapping regions; and creating an SEM image of a wide field of view that covers the observation area by synthesizing the SEM images of the divisional areas.

7. The image creation method according to claim 6, wherein the step of executing the first aligning operation includes the steps of:

acquiring coordinate data held by data on the SEM image of each of the divisional areas;

converting the coordinate data for the divisional areas into coordinate data for the designated observation area; and synthesizing the SEM images of adjacent divisional areas on the basis of the converted coordinate data for the divisional areas.

8. The image creation method according to claim 6, wherein the step of executing the second aligning operation includes the steps of:

detecting a pattern for the aligning operation included in an overlapping region where portions of the adjacent divisional areas overlap each other;

detecting an edge of the pattern in each of the divisional areas with precision of $1/100$ pixels;

calculating the difference between an edge position of the pattern in one of the divisional areas and the corresponding edge position of the pattern in another one of the divisional areas; and correcting the coordinate data of the divisional areas so that the difference becomes zero.

9. The image creation method according to claim 8, wherein the step of detecting the pattern for the aligning operation includes the steps of:

detecting a first overlapping region of a first divisional area with a second divisional area that is adjacent to the first divisional area in an X direction, and a second overlapping region of the first divisional area with a third divisional area that is adjacent to the first divisional area in a Y direction, and then detecting patterns included in the first overlapping region and patterns included in the second overlapping region; and selecting, as the patterns for the aligning operation, patterns of an overlapping region having more patterns among the first overlapping region and the second overlapping region.

10. The image creation method according to claim 8, wherein the step of detecting the pattern for the aligning operation is a step of detecting an overlapping region shared by four of the divisional areas, and selecting a pattern included in the overlapping region as a pattern for the aligning operation.

* * * * *